United States Patent [19]

Ishikawa

[11] Patent Number: 4,983,858
[45] Date of Patent: Jan. 8, 1991

[54] LEVEL DETERMINING CIRCUIT GENERATING OUTPUT SIGNAL AT FIRST OR SECOND OUTPUT TERMINAL ACCORDING TO LEVEL OF INPUT SIGNAL

[75] Inventor: Tsutomu Ishikawa, Gunma, Japan
[73] Assignee: Sanyo Electric Co., Ltd., Moriguchi, Japan
[21] Appl. No.: 404,012
[22] Filed: Sep. 7, 1989
[30] Foreign Application Priority Data Sep. 8, 1988 [JP] Japan .................. 63-118001[U]

[51] Int. Cl.$^5$ .................. H03K 5/153; G06G 7/12
[52] U.S. Cl. .................. 307/362; 307/359; 307/494
[58] Field of Search .................. 307/296.4, 362, 494, 307/490, 359, 572, 491

[56] References Cited

U.S. PATENT DOCUMENTS

| | | | |
|---|---|---|---|
| 4,459,493 | 7/1984 | Moore | 307/494 |
| 4,527,076 | 7/1985 | Matsuo et al. | 307/490 |
| 4,791,317 | 12/1988 | Winnerl et al. | 307/296.4 |
| 4,859,871 | 8/1989 | Kobayashi et al. | 307/359 |
| 4,939,750 | 7/1990 | Nakamura | 307/359 |

FOREIGN PATENT DOCUMENTS 0094922  5/1984  Japan .................. 307/572

Primary Examiner—Stanley D. Miller
Assistant Examiner—Toan Tran
Attorney, Agent, or Firm—Armstrong, Nikaido, Marmelstein, Kubovcik & Murray

[57] ABSTRACT

A level determining circuit compares an input signal and a reference signal in level, generates a first output signal at a first output terminal (11) when the former is greater than the latter, and generates a second output signal at a second output terminal (12) if the former is smaller than the latter. A switch (15) is disposed in the preceding stage of the first output terminal, which will be opened if the first output signal is not required. A buffer amplifier portion (14) of high input impedance is further provided in the preceding stage of this switch so that the level determining operation can not be influenced by the change in impedance caused by switching of the switch.

5 Claims, 3 Drawing Sheets

LEVEL DETERMINING CIRCUIT GENERATING OUTPUT SIGNAL AT FIRST OR SECOND OUTPUT TERMINAL ACCORDING TO LEVEL OF INPUT SIGNAL

BACKGROUND OF THE INVENTION

1. Field of the Invention

The present invention relates generally to level determining circuits, and more particularly, to a general purpose type of level determining circuit suitable for being implemented as a semiconductor integrated circuit.

2. Description of the Background Art

General purpose level determining circuits with wide range of applicability have been implemented so far as semiconductor integrated circuits. As an example of such level determining circuits, there exists one which comprises an input terminal and first and second output terminals for generating an output signal at the first or second output terminal according to the level of an input signal. Such a level determining circuit is used, for example, to perform balance control by determining the respective levels of L and R signals in a balance adjusting circuit of a stereo system.

FIG. 1 is a circuit diagram showing an example of such conventional level determining circuits. Basically, the illustrated circuit determines the level of an input signal for operating in such a manner that it generates a first output signal at a first output terminal if the level is higher than a predetermined reference value, or generates a second output signal at a second output terminal if the level is lower than the predetermined reference value.

Referring to FIG. 1, input signal is applied to a non-inverted input terminal of a comparing portion 1 through a terminal 19 and a predetermined reference voltage is applied to an inverted input terminal thereof.

When an input signal at a higher level than the reference voltage applied to the inverted input terminal is applied to the non-inverted input terminal of the comparing portion 1, a positive output signal is generated from the comparing portion 1. This positive output signal is supplied to a first output terminal 11 through a diode 2, a resistance 5 and a switch 10.

Meanwhile, when an input signal at a lower level than the preceding reference voltage is applied to the non-inverted input terminal of the comparing portion 1, a negative output signal is generated from the comparing portion 1. This negative output signal is supplied to a second output terminal 12 through a diode 3 and a resistance 8.

Operation of the level determining circuit shown in FIG. 1 will be described in more detail below. Now, assuming that input signal $V_{IN}$ is greater than reference voltage $V_{REF}$, with $V_{IN}$ as an input signal and $V_{REF}$ as a reference voltage of a reference voltage source 13, the level $V_1$ of the positive output signal generated at the first output terminal 11 is defined by the following expression:

$$V_1 = (V_{IN} - V_{REF}) \cdot \frac{R_3(R_1 + R_4 + R_5 + R_6)}{(R_4 + R_5 + R_6)(R_2 + R_3)} + V_{REF} \quad (1)$$

where $R_1$ through $R_6$ represent resistance values of the resistances 4 through 9, respectively.

On the other hand, assuming that input signal $V_{IN}$ is smaller than reference voltage $V_{REF}$, the level $V_2$ of the negative output signal generated at the second output terminal 12 is defined by the following expression:

$$V_2 = (V_{IN} - V_{REF}) \cdot \frac{R_6(R_4 + R_1 + R_2 + R_3)}{(R_1 + R_2 + R_3)(R_5 + R_6)} + V_{REF} \quad (2)$$

Therefore, the circuit shown in FIG. 1 operates as a level determining circuit which generates an output signal at the first output terminal 11 or the second output terminal 12 according to the level of an input signal.

In addition, the following relation should be established in order to ensure equal bias voltages of the diodes 2 and 3.

$$R_2 + R_3 = R_5 + R_6$$

In such a level determining circuit as described in the above, it may be required that either one of the output signals supplied at the first and second output terminals should be disconnected by means of a switch for various reasons. For example, the conventional level determining circuit shown in FIG. 1 is constructed in such a manner that supply of the first output signal to the first output terminal 11 can be disconnected if required.

However, in a conventional example as shown in FIG. 1, if the switch 10 disconnects supply of the first output signal, impedance on the side of the switch 10 with respect to the node between resistances 5 and 6 will change corresponding to the opening of the switch 10 which results in fluctuation of the reference voltage applied to the negative input terminal of the comparing portion 1. Thus, there has been a problem that such switching of the switch 10 prevents precise determination about the level of an input signal.

SUMMARY OF THE INVENTION

An object of the present invention is to provide a level determining circuit capable of determining precisely the level of an input signal even where one of the output signals from the comparing portion is disconnected.

Another object of the present invention is to provide a level determining circuit capable of preventing fluctuation in the reference voltage which is applied to the input terminal of the comparing portion, even where one of the output signals from the comparing portion is disconnected.

Briefly stated, a level determining circuit according to the present invention comprises a reference voltage source, a comparing circuit for outputting a signal of one polarity in accordance with the relation of magnitude between two inputs, an input terminal for supplying an input signal to one input of the comparing circuit therethrough, first and second diodes connected to the output of the comparing portion to have the opposite polarities to each other, first and second feedback resistances each for feeding back the output of the comparing circuit which has been rectified by the first or second diode to the other input of the comparing circuit, resistances for applying a reference voltage from the reference voltage source to each of the first node between the first diode and the first feedback resistance and the second node between the second diode and the second feedback resistance, a first output terminal for supplying a signal obtained at the first node therethrough, a second output terminal for supplying a signal obtained at the second node therethrough, a buffer amplifier interposed in at least either one of the first signal path between the first node and the first output terminal and the second signal path between the second node and the second output terminal and a switch for disconnecting the output of the buffer amplifier.

The primary advantage of the present invention, therefore, is to be able to prevent the reference voltage for level comparison from being influenced by the fluctuation in impedance which is caused by switching a switch, with the use of a buffer amplifier of high input impedance disposed in the preceding stage of the switch.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
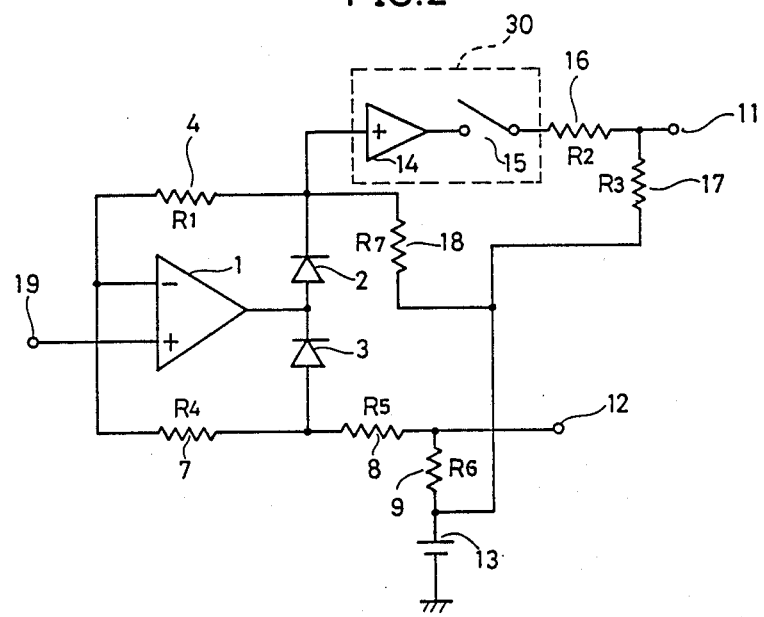
FIG. 2 is a circuit diagram showing a level determining circuit according to an embodiment of the present invention.

Referring to FIG. 2, a level determining circuit according to an embodiment of the present invention will be described.

Figure 1:
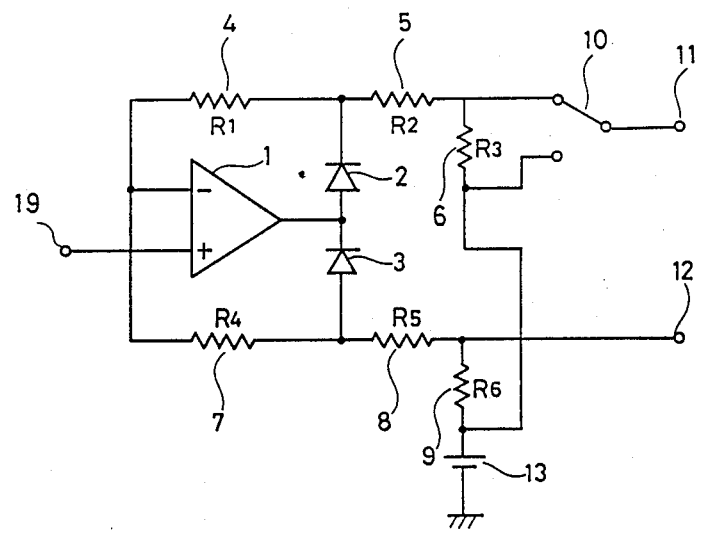
FIG. 1 is a circuit diagram showing an example of the conventional level determining circuits.

The circuit shown in FIG. 2 is the same as the conventional level determining circuit shown in FIG. 1 except for the following point. That is, the cathode of the diode 2 is connected to a buffer amplifier portion 14 having a high input impedance and a gain of unity, and a switch 15 is interposed between the output of the buffer amplifier portion 14 and the first output terminal 11. Meanwhile, voltage of an output signal outputted through the switch 15 will be divided by a resistance 16 of resistance value $R_2$ and a resistance 17 of resistance value $R_3$. Furthermore, a reference voltage $V_{REF}$ from the reference voltage source 13 is applied to the cathode of the diode 2 through a resistance 18 of resistance value $R_7$.

Referring to FIG. 2, the inverted input terminal of the comparing portion 1 receives the reference voltage $V_{REF}$ from the reference voltage source 13 in the initial state. Now, when an input signal at a higher level than the aforementioned reference voltage is applied to the non-inverted input terminal of the comparing portion 1 through the terminal 19, a positive output signal will be generated from the comparing portion 1 (solid line a in FIG. 3). The output signal then appears at the cathode of the diode 2. The output signal which has appeared at this cathode will be fed back to the inverted input terminal of the comparing portion 1 through the resistance 4 which functions as a feedback resistance. As a result, a negative feedback operation will be performed to make the voltages at the non-inverted and inverted input terminals of the comparing portion 1 equal to the aforementioned input signal voltage. Therefore, the level $V_3$ of the output signal obtained at the cathode of the diode 2 (b in FIG. 3) is defined by the following expression.

$$V_3 = (V_{IN} - V_{REF}) \cdot \frac{R_1 + R_4 + R_5 + R_6}{R_4 + R_5 + R_6} + V_{REF} \quad (3)$$

This output signal $V_3$ is passed through the buffer amplifier portion 14 having a high input impedance and a gain of unity and the switch 15, and then divided in voltage by the resistances 16 and 17 before outputted from the first output terminal 11. Therefore, if the resistance values of the resistances 16 and 17 are set to the same values $R_2$ and $R_3$ of the resistances 5 and 6 in the conventional circuit shown in FIG. 1, the level of $V_1$ of the output signal obtained at the first output terminal 11 in the embodiment of FIG. 2 will be given by the same expression (1) which defines $V_1$ in the conventional circuit shown in FIG. 1.

Meanwhile, an output signal $V_2'$ which will be obtained at the second output terminal 12 in FIG. 2 is given by the following expression:

$$V_{2'} = (V_{IN} - V_{REF}) \cdot \frac{R_6}{R_4 + R_5 + R_6} + V_{REF} \quad (4)$$

where if a relationship defined by the following expression can be seen between the resistance values $R_4$, $R_5$ and $R_6$ of the resistances 7, 8 and 9, i.e., if:

$$R_4 + R_5 >> R_6$$

the output signal $V_2'$ which is obtained at the second output terminal 12 of the embodiment in FIG. 2 will be as follows:

$$V_{2'} \approx V_{REF}$$

Consequently, it can be said that the output signal at the second output terminal 12 is held approximately at a fixed level.

Figure 3:
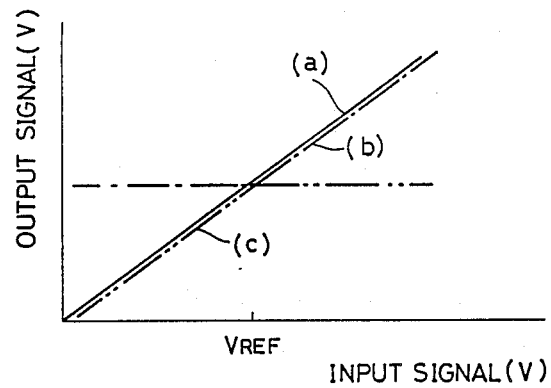
FIG. 3 is a diagram showing the characteristics of the embodiment shown in FIG. 2.

On the other hand, if an input signal at a lower level than the aforementioned reference voltage is applied to the non-inverted input terminal of the comparing portion 1, a negative output signal is generated from the comparing portion 1 (solid line a in FIG. 3). The output signal then appears at the anode of the diode 3. The output signal which has appeared at this anode will be fed back to the inverted input terminal of the comparing portion 1 through the resistance 7 which functions as a feedback resistance. The level $V_4$ of the output signal thus obtained (c in FIG. 3) at the anode of the diode 3 is given by the following expression.

$$V_4 = (V_{IN} - V_{REF}) \cdot \frac{R_4 + R_1 + R_7}{R_1 + R_7} + V_{REF} \quad (5)$$

This output signal $V_4$ is divided in voltage by the resistances 8 and 9 and then outputted from the second output terminal 12. Therefore, if a relationship defined by the following expression can be seen between the resistances values $R_2$, $R_3$ and $R_7$ of the resistances 16, 17 and 18, i.e., if:

$$R_7 = R_2 + R_3$$

the level $V_2$ of the output signal obtained at the second output terminal 12 of the embodiment in FIG. 2 will be equal to the $V_2$ as shown by the expression (2) of the example in FIG. 1.

In this case, the output signal $V_1'$ which is obtained at the first output terminal 11 of FIG. 2 will be defined as follows:

$$V_{1'} = (V_{IN} - V_{REF}) \cdot \frac{R_7}{R_1 + R_7} \cdot \frac{R_3}{R_2 + R_3} + V_{REF} \quad (6)$$

where a relationship defined by the following expression can be seen between the resistance values $R_1$ and $R_7$ of the resistances 4 and 18, i.e., if:

$$R_1 >> R_7$$

the output signal $V_1'$ which is obtained at the first output terminal 11 of the embodiment shown in FIG. 2 will be as follows:

$$V_1' \approx V_{REF}$$

Consequently, it can be said that the level of the output signal at the first output terminal 11 is held approximately at a fixed level.

In the embodiment shown in FIG. 2, if there is no need for the output signal obtained at the first output terminal 11, the switch 15 may be opened as illustrated. In this case, since the buffer amplifier portion 14 of high input impedance is disposed in the preceding stage of the switch 15, impedance change due to the opening of the switch 15 can not exert any influence on the preceding stage of the buffer amplifier portion. Therefore, the output signal obtained at the second output terminal 12 will not make any change even if the switch 15 is operated to be opened.

Figure 4:
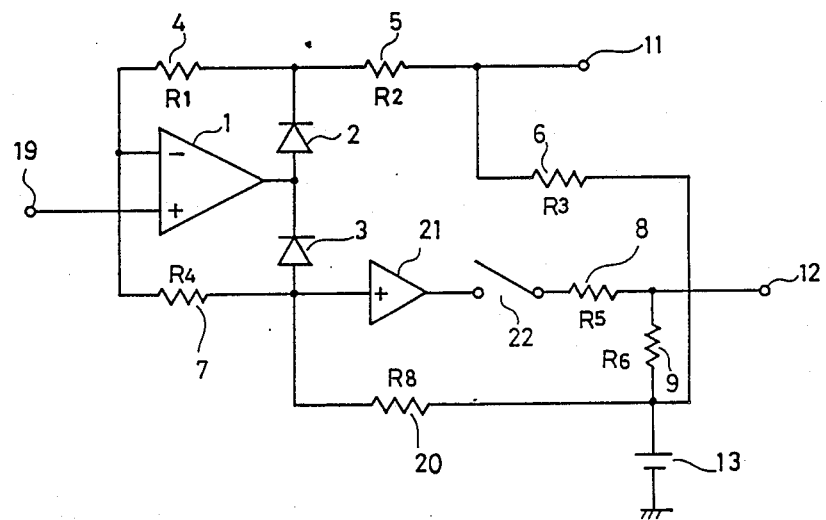
FIG. 4 is a circuit diagram showing a level determining circuit according to another embodiment of the present invention.
Figure 5:
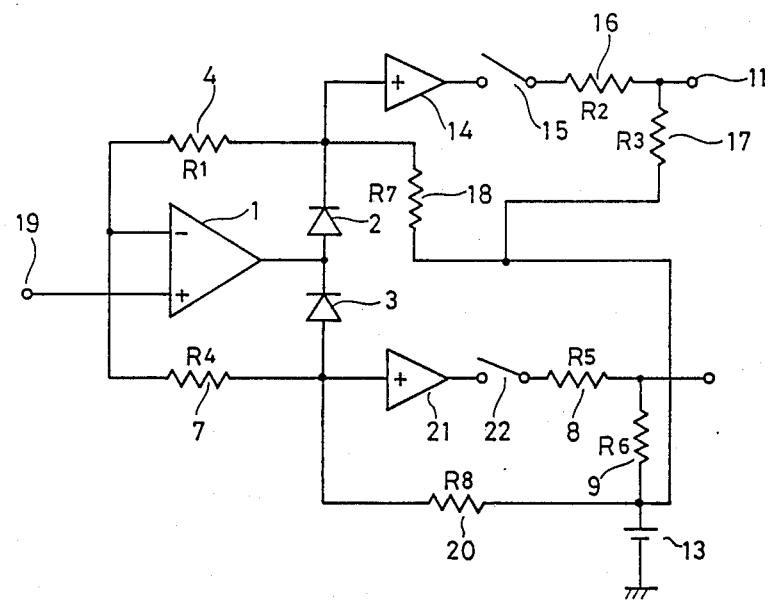
FIG. 5 is a circuit diagram showing a level determining circuit according to still another embodiment of the present invention.

Though, in the above described second embodiment, a description has been made on a case where switch 15 is interposed in the path of the first output signal, the present invention is also applicable to the cases where a switch is interposed in the path of the second output signal, or switches are interposed in the both paths of the first and second output signals. FIG. 4 shows another embodiment of the present invention in which a buffer amplifier portion 21 and a switch 22 are interposed in the path of the second output signal, and FIG. 5 shows still another embodiment of the present invention where the buffer amplifier portion 14 and the switch 15 are interposed in the path of the first output signal, and further the buffer amplifier portion 21 and the switch 22 are interposed in the path of the second output signal. Also in these embodiments, a buffer amplifier portion is provided in the preceding stage of each switch so that a level determining circuit can be provided which is not influenced by the change in impedance caused by opening of a switch.

Figure 6:
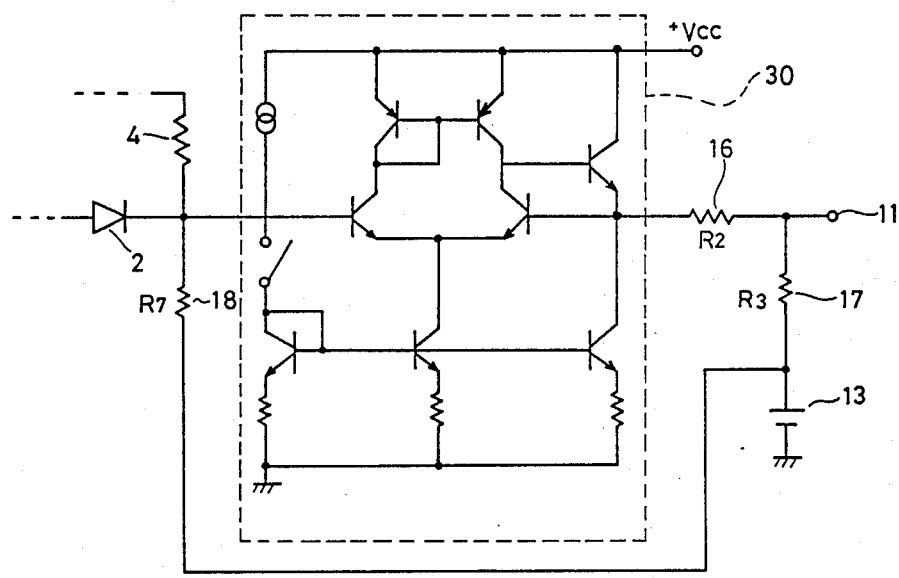
FIG. 6 is a circuit diagram showing a modified version of the circuit shown in FIG. 2.

Furthermore, FIG. 6 is a circuit diagram showing a circuit equivalent to the portion 30 comprising the buffer amplifier portion 14 and the switch 15 shown in FIG. 2. If the buffer amplifier 14 and the switch 15 are integrated as shown in FIG. 6, the number of the elements can be reduced in implementing the circuit as an integrated circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level determining circuit comprising:
   a reference voltage source (13),
   comparing means (1) for outputting a signal of one polarity in accordance with the relation of magnitude between two inputs,
   means (19) for supplying an input signal to one input of said comparing means therethrough,
   first and second rectifying means (2, 3) connected to the output of said comparing means to have the opposite polarities to each other,
   first and second feedback resistance means (4, 7) each for feeding back the output of said comparing means which has been rectified by said first or second rectifying means to the other input of said comparing means,
   means (8, 9, 18) for applying a reference voltage from said reference voltage source to each of the first node between said first rectifying means and said first feedback resistance means and the second node between said second rectifying means and said second feedback resistance means,
   first output terminal (11) for supplying a signal obtained at said first node therethrough,
   second output terminal (12) for supplying a signal obtained at said second node therethrough,
   buffer amplifier means (14) interposed in at least either one of the first signal path between said first node and said first output terminal and the second signal path between said second node and said second output terminal, and
   switch means (15) for disconnecting the output of said buffer amplifier means.

2. The level determining circuit according to claim 1, which further comprises resistance means for dividing voltage of the output of said buffer amplifier means.

3. The level determining circuit according to claim 1, wherein
   said comparing means generates a positive output signal when said input signal is greater than said reference signal, and generates a negative output signal when said input signal is smaller than said reference signal.

4. The level determining circuit according to claim 1, wherein
   said first and second rectifying means comprise diodes.

5. The level determining circuit according to claim 1, wherein
   said reference voltage applying means comprises
   first resistance means for applying said reference voltage to said first node, and
   second resistance means for applying said reference voltage to said second node, and
   said first and second resistance means having the same resistance values.

* * * * *